United States Patent
Doros et al.

(10) Patent No.: US 7,262,070 B2
(45) Date of Patent: Aug. 28, 2007

(54) METHOD TO MAKE A WEIGHT COMPENSATING/TUNING LAYER ON A SUBSTRATE

(75) Inventors: Theodore Doros, Sunnyvale, CA (US); Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 106 days.

(21) Appl. No.: 10/675,587

(22) Filed: Sep. 29, 2003

(65) Prior Publication Data

US 2005/0070119 A1    Mar. 31, 2005

(51) Int. Cl.
*H01L 21/00* (2006.01)

(52) U.S. Cl. .................... 438/50; 438/52; 438/668; 257/E21.297

(58) Field of Classification Search ............ 438/258, 438/669, 671, 666, 587, 50, 52; 430/314, 430/311
See application file for complete search history.

(56) References Cited

U.S. PATENT DOCUMENTS

| | | | | |
|---|---|---|---|---|
| 5,015,602 A | * | 5/1991 | Van Der Plas et al. | 438/424 |
| 5,112,440 A | * | 5/1992 | Banks et al. | 216/13 |
| 5,155,053 A | * | 10/1992 | Atkinson | 438/577 |
| 5,502,564 A | * | 3/1996 | Ledger | 356/503 |
| 5,770,350 A | | 6/1998 | Lee | |
| 5,976,769 A | * | 11/1999 | Chapman | 430/316 |
| 6,387,808 B1 | * | 5/2002 | Schiltz et al. | 438/689 |
| 6,437,903 B1 | * | 8/2002 | Kozhukh | 359/291 |
| 6,570,468 B2 | * | 5/2003 | Ma et al. | 333/188 |
| 2002/0187434 A1 | * | 12/2002 | Blatchford et al. | 430/322 |
| 2003/0042561 A1 | * | 3/2003 | Funaki | 257/415 |

FOREIGN PATENT DOCUMENTS

| | | |
|---|---|---|
| DE | 4339466 A1 | 5/1995 |
| EP | 1104097 A2 | 5/2001 |
| EP | 1170862 A2 | 1/2002 |
| EP | 1258990 A2 | 11/2002 |
| JP | 4326613 | 11/1992 |
| WO | PCT/US2004/032062 | 12/2004 |

* cited by examiner

*Primary Examiner*—Michael Trinh
(74) *Attorney, Agent, or Firm*—Blakely, Sokoloff, Taylor & Zafman LLP

(57) ABSTRACT

Embodiments of the present invention form a weight-compensating/tuning layer on a structure (e.g., a silicon wafer with one or more layers of material (e.g., films)) having variations in its surface topology. The variations in surface topology take the form of thick and thin regions of materials. The weight-compensating/tuning layer includes narrow and wide regions corresponding to the thick and thin regions, respectively.

18 Claims, 5 Drawing Sheets

FORM LAYER OF MATERIAL ON WAFER HAVING THICK AND THIN REGIONS
102

FORM NARROW AND WIDE REGIONS IN THE LAYER OF MATERIAL THAT CORRESPOND TO THICK AND THIN REGIONS OF THE WAFER
104

METHOD TO MAKE A WEIGHT COMPENSATING/TUNING LAYER ON A SUBSTRATE

BACKGROUND

1. Field

Embodiments of the present invention relate to integrated circuits and, in particular, to integrated circuit fabrication processes.

2. Discussion of Related Art

In general, the basic process used in fabricating integrated circuits includes a material deposition stage, a patterning stage, a material removal stage, a doping stage, and a heating stage. The particular stages used depend on the type of devices to be included on the integrated circuit.

In the deposition stage, many thin layers of material (e.g., films), each with particular properties, are deposited on a silicon wafer using known techniques, such as chemical vapor deposition (CVD). Due to variations in wafer processing tools and/or techniques, sometimes the wafer may have variations in its surface topology. When a layer of material is then deposited on the wafer surface, the deposited layer may conform to the surface topology of the wafer. The result tends to be uneven distribution of material.

Thickness variations can be particularly troublesome if fabricated components are to be used as frequency-selective devices commonly found in communication systems such as cellular telephone systems that are intended to resonate at a particular frequency. This is because the weight distribution of material on the wafer determines the resonance frequency. The resonance frequency determines the channel of operation. When the weight distribution cannot be controlled, the resonance frequency cannot be controlled and thus the operating channel cannot be controlled.

Traditional solutions to thickness variations include adding a chemical mechanical planarization/polishing (CMP) stage to the fabrication process. CMP is a process technology used to planarize (i.e., make flat) one or more layers deposited on a wafer. In a typical CMP process the wafer is rotated and is polished (or planarized) using chemical slurry. This solution is adequate in many instances, but has limitations. For example; CMP is not selective enough and may thin an already thin area on the layer of material while attempting to thin a thicker area. Additionally, using CMP to planarize a layer of material adds an extra stage to the fabrication process.

Another solution involves measuring the resonance frequency of the devices and discarding defective components. This post situ or after the fact solution can be quite expensive, however. For example, the components must are already be fabricated before determining whether they are suitable for use in a particular application.

Other solutions include laser correction, which also is a post situ or post fabrication solution. As a result, it can be expensive and time consuming as well.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 1 is a flowchart illustrating a process for fabricating a semiconductor device according to an embodiment of the present invention;

DETAILED DESCRIPTION OF THE ILLUSTRATED EMBODIMENTS

Figure 2A:
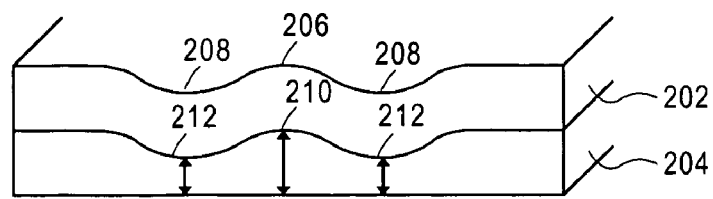
FIGS. 2a, 2b, 2c, and 2d depict cross-section views of a structure fabricated according to an embodiment of the present invention.
Figure 2B:
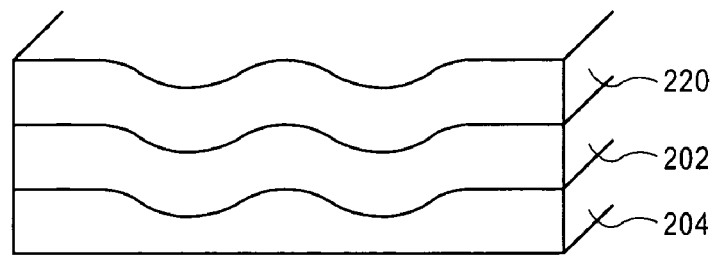
Figure 2C:
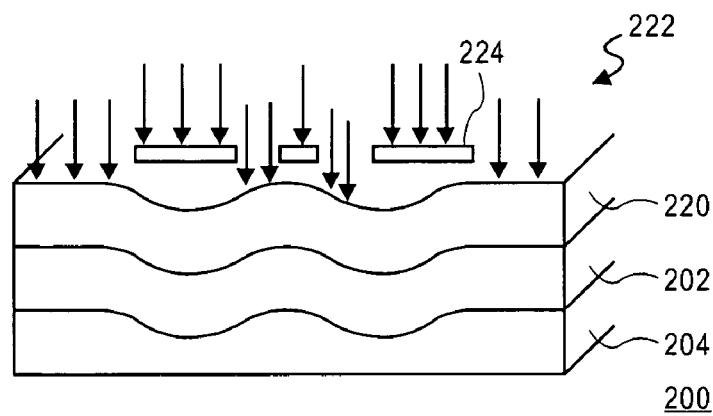
Figure 2D:
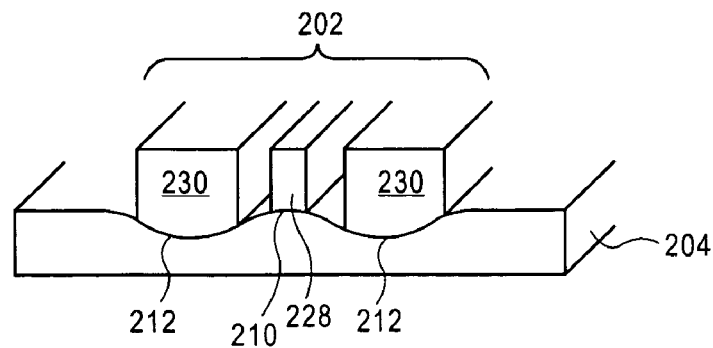

FIG. 1 is a flowchart illustrating a process 100 for fabricating one or more structures according to an embodiment of the present invention. FIGS. 2a, 2b, 2c, and 2d depict cross-section views of stages of fabrication of a semiconductor structure 200 using the process 100 according to an embodiment of the present invention. A machine-accessible medium with machine-readable instructions thereon may be used to cause a machine to perform the process 100. Of course, the process 100 is only an example process and other processes may be used to implement embodiments of the present invention.

The operations of the process 100 are described as multiple discrete blocks performed in turn in a manner that is most helpful in understanding embodiments of the invention. However, the order in which they are described should not be construed to imply that these operations are necessarily order dependent or that the operations be performed in the order in which the blocks are presented.

In a block 102, a layer of material 202 is formed on a wafer or a substrate 204. The layer 202 may have variations in its surface topology comprising thick 206 and thin 208 regions corresponding to wafer 204 thick 210 and thin 212 regions caused by variations in the surface topology of the wafer 204.

In one embodiment, the layer 202 may be deposited using a known chemical vapor deposition (CVD) technique such as rapid thermal chemical vapor deposition (RTCVD) or reduced pressure chemical vapor deposition (RPCVD). Alternatively, the layer 202 may be deposited using known sputtering techniques.

In a block 104, narrow and wide regions are formed in the layer 204 that compensate for variations in the surface topology of the wafer 204. The narrow and wide regions in the layer 202 correspond to the thick and thin regions 210 and 212, respectively. The narrow and wide regions in the layer 202 may compensate for uneven weight distribution caused by variations in the surface topology of the wafer 204. Alternatively, the resulting layer 202 may provide controlled tuning (e.g., frequency tuning, wavelength tuning, resistivity tuning, etc.) despite variations in the surface topology of the wafer 204.

The example narrow and wide regions of the layer 202 may be formed as follows using photolithography and a photosensitive polymer (photoresist). For example, a layer of photoresist 220 may be disposed on the layer 202. The photoresist 220 may be exposed to light 222 through a mask 224. The mask 224 may have an existing pattern to which near-resolution marks have been added. The near-resolution marks may be used to define narrow and wide regions of the layer 202 to correspond to thick and thin regions 210 and 212 of the wafer 204.

Techniques for adding near-resolution marks to an existing mask pattern are known but not currently applied in this manner (i.e., to define the narrow and wide regions that correspond to thick and thin regions of a layer of material on a wafer or substrate). Typically, near-resolution marks are used to produce very small structures. Thus, it is counterintuitive to use near-resolution marks to modulate such large areas according to embodiments of the present invention.

The exposed photoresist 220 may be developed and removed to reveal the location of areas defined by the near-resolution marks as well as the existing mask pattern. Areas of the layer 202 are removed (e.g., trimmed using known etching techniques) to leave narrow 228 and wide 230 regions corresponding to thick and thin regions 210 and 212, respectively. Thus, the wafer 204 surface topology variations determine the size of the narrow regions 228 and the wide regions 230. The remaining photoresist 220 may be removed from the layer 202.

The example thick and thin regions 210 and 212 of the wafer 204 may be characterized using a zone-compensation technique. This embodiment may be implemented when there is systematic process non-uniformity across wafers 204 being fabricated.

In one embodiment of the present invention, in-line thickness metrology may be used to characterize the thick regions 210 of the wafer 204 as one zone and the thin regions 212 as a second zone. Suitable in-line thickness metrology techniques are known and will not be described further herein.

In another embodiment, frequency yield maps may be used to characterize the thick regions 210 of the wafer 204 as one zone and the thin regions 212 as a second zone. Suitable frequency yield mapping techniques are known and will not be described further herein.

In still another embodiment, the example thick and thin regions 210 and 212 may be characterized using a known ellipsometric mapped-compensation technique. Suitable ellipsometric mapping techniques are known and will not be described further herein.

In still another embodiment, the example thick and thin regions 210 and 212 may be characterized using a known laser mapped-compensation technique. Suitable laser mapping techniques are known and will not be described further herein.

In still another embodiment, the example thick and thin regions 210 and 212 may be characterized using a known capacitance mapped-compensation technique. Suitable capacitance mapping techniques are known and will not be described further herein.

Ellipsometric mapping, capacitance mapping, laser mapping, or other suitable mapping technique can be accomplished using in situ mapping of the thick and thin regions 210 and 212 on individual wafers 204. Alternatively, ellipsometric mapping, capacitance mapping, laser mapping, or other suitable mapping technique can be accomplished using ex situ mapping of the thick and thin regions 210 and 212 on individual wafers 204. These embodiments may be implemented when there is no systematic process non-uniformity across wafers 204.

The wafer 204 may be a silicon (Si) wafer. Alternatively, the wafer 204 may be a germanium (Ge) wafer or a gallium arsenide (GaAs) wafer. In embodiments in which the wafer 204 may be a silicon (Si) wafer, a germanium (Ge) wafer, or a gallium arsenide (GaAs) wafer, the layer 202 may be silicon (Si), germanium (Ge), or gallium arsenide (GaAs), respectively. Of course, other materials may be used and after reading the description herein a person of ordinary skill in the relevant art would readily recognize how to implement the layer 202 using various other materials (e.g., metal or metallic alloy, a ceramic, an organic compound, or other suitable material).

The structure 200 may be a micro-electrical-mechanical system (MEMS) such as that used in electronic devices, medical devices, communication devices, automobiles, military defense systems, etc. For example, the structure 200 may be used as pressure sensors (e.g. blood pressure, fuel, air, etc), radio frequency (RF) components (e.g., filters, resonators, switches, etc.), airbag sensor, earthquake sensors, aircraft control, etc.

Figure 3:
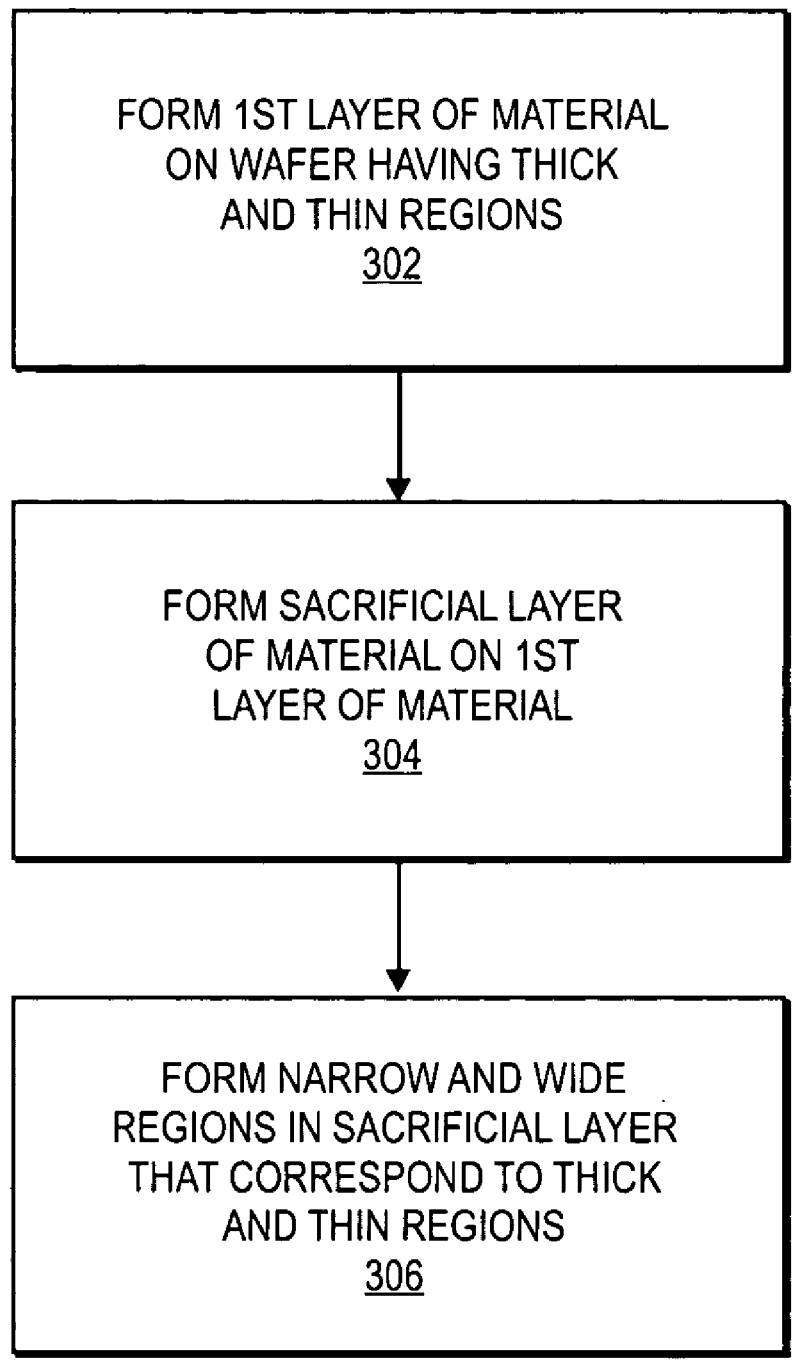
FIG. 3 is a flowchart illustrating a process for fabricating a semiconductor device according to an alternative embodiment of the present invention.
Figure 4A:
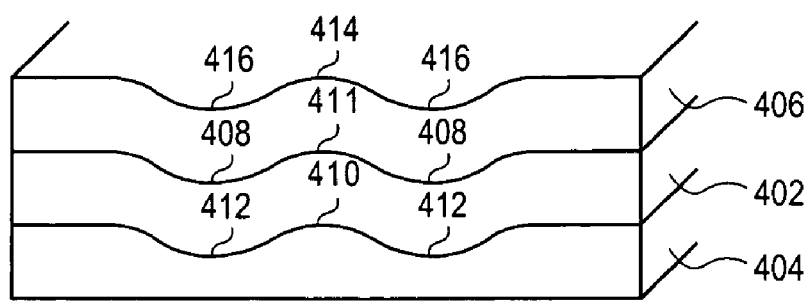
FIGS. 4a, 4b, and 4c depict cross-section views of a structure fabricated according to an alternative embodiment of the present invention.
Figure 4B:
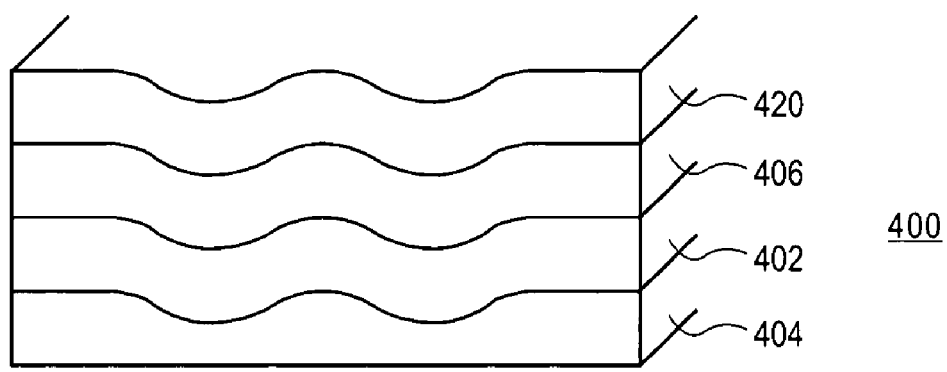
Figure 4C:
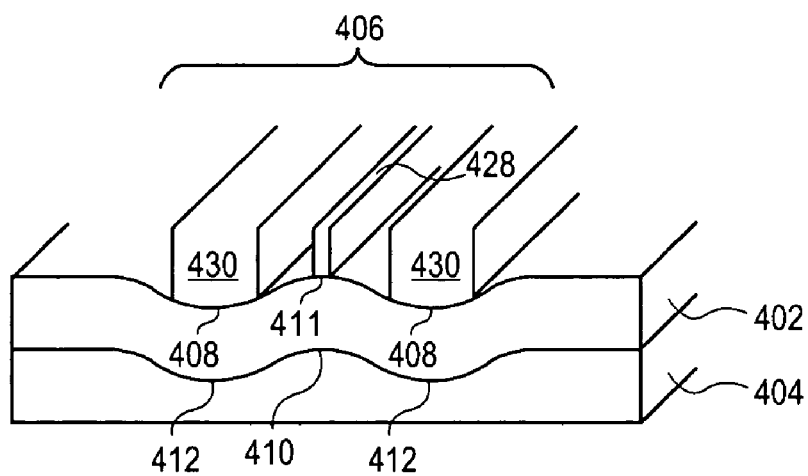

FIG. 3 is a flowchart illustrating a process 300 for fabricating one or more structures according to an embodiment of the present invention. FIGS. 4a, 4b, and 4c depict cross-section views of stages of fabrication of a semiconductor structure 400 using the process 300 according to an embodiment of the present invention. A machine-accessible medium with machine-readable instructions thereon may be used to cause a machine to perform the process 300. Of course, the process 300 is only an example process and other processes may be used to implement embodiments of the present invention.

The operations of the process 300 are described as multiple discrete blocks performed in turn in a manner that is most helpful in understanding embodiments of the invention. However, the order in which they are described should not be construed to imply that these operations are necessarily order dependent or that the operations be performed in the order in which the blocks are presented.

In a block 302, a layer of material 402 is formed on a wafer 404. The layer 402 may have variations in its surface topology comprising thick 411 and thin 408 regions corresponding to wafer 204 thick 410 and thin 412 regions caused by variations in the surface topology of the wafer 404.

In a block 304, a sacrificial layer 406 of material is formed on layer 402. The sacrificial layer 406 may have thick 414 and thin 416 regions corresponding to thick and thin regions 410 and 412 of the wafer 404 and/or thick and thin regions 411 and 408 of the layer 402.

In a block 306, narrow and wide regions are formed in the sacrificial layer 406. The narrow and wide regions in the layer 402 correspond to the thick and thin regions 410 and 412, respectively. The narrow and wide regions in the layer 406 may compensate for uneven weight distribution caused by variations in the surface topology of the wafer 404. Alternatively, the resulting layer 406 may provide controlled tuning (e.g., frequency tuning, wavelength tuning, resistivity tuning, etc.) despite variations in the surface topology of the wafer 404.

In embodiments of the present invention, the narrow and wide regions of the sacrificial layer 406 are formed as follows using electron beam, ultraviolet (UV) light, optical beam, or x-ray direct write of a near-resolution pattern on photoresist. For example, a layer of photoresist 420 may be disposed on the sacrificial layer 406. An electron beam, UV light, optical beam, or x-rays may be directed at the photoresist 420 (e.g., scanned) to draw a near-resolution pattern in the photoresist 420. The near-resolution pattern may define narrow and wide regions of the sacrificial layer 406 to correspond to thick and thin regions 410 and 412 of the wafer 404.

The exposed photoresist 420 is developed and removed to reveal the location of areas defined by the near-resolution pattern. Exposed areas of the sacrificial layer 406 are removed (e.g., trimmed using known etching techniques) to leave narrow 428 and wide 430 regions corresponding to thick and thin regions 410 and 412, respectively. In an alternative embodiment, exposed areas of the sacrificial layer 406 may be removed using planarization. For example, exposed areas of the sacrificial layer 406 may be removed using CMP techniques.

The remaining photoresist 420 is removed from the sacrificial layer 406. In one embodiment, the photoresist 420 may be a non-conforming photoresist (i.e., non-polymer or dry photoresist) that is sputter deposited on the sacrificial layer 406. The photoresist 420 is exposed thermally and the near-resolution inorganic pattern remains on the sacrificial layer 406. In this embodiment, the photoresist 420 may be removed using known techniques (e.g., plasma cleaning, ion milling, etc.).

In one embodiment, example thick and thin regions 410 and 412 of the wafer 404 may be determined and the narrow and wide regions the narrow and wide regions 428 and 430 of the layer 406 subsequently formed using a zone-compensation technique similar to that described with respect to FIGS. 1 and 4a through 4c above.

In zones having the thick regions 410, the depth of focus of the light source and thus the spatial range of the light may be different than the depth of focus and the spatial range in the zones in the thin regions 412 (e.g., in the shape of the near-resolution pattern). Thus when the photoresist on the layer 404 is exposed and developed, the areas of the layer 404 can be removed leave the narrow regions 428 in the first zone and the wide regions 430 in the second zone.

Alternatively, the zones having the thick regions 410 may receive different imaging compensation (e.g., dose, depth of focus, etc.) than the zones having the thinner regions 412.

Example thick and thin regions 410 and 412 of the wafer 404 or the layer 402 may be characterized using a zone-compensation technique (e.g., in-line thickness metrology, frequency yield maps, ellipsometric mapping, laser mapping, capacitance mapping, etc.) similar to that described with respect to FIGS. 1 and 4a through 4c above. After reading the description herein, a person of ordinary skill will readily recognize how to implement the mapped-compensation technique to form the narrow and wide regions 428 and 430.

The sacrificial layer 406 may be silicon (Si), germanium (Ge), gallium arsenide (GaAs), or other suitable material. After reading the description herein a person of ordinary skill in the relevant art would readily recognize how to implement the sacrificial layer 406 using various other materials (e.g., metal or metallic alloy, a ceramic, an organic compound, or other suitable material).

Figure 5:
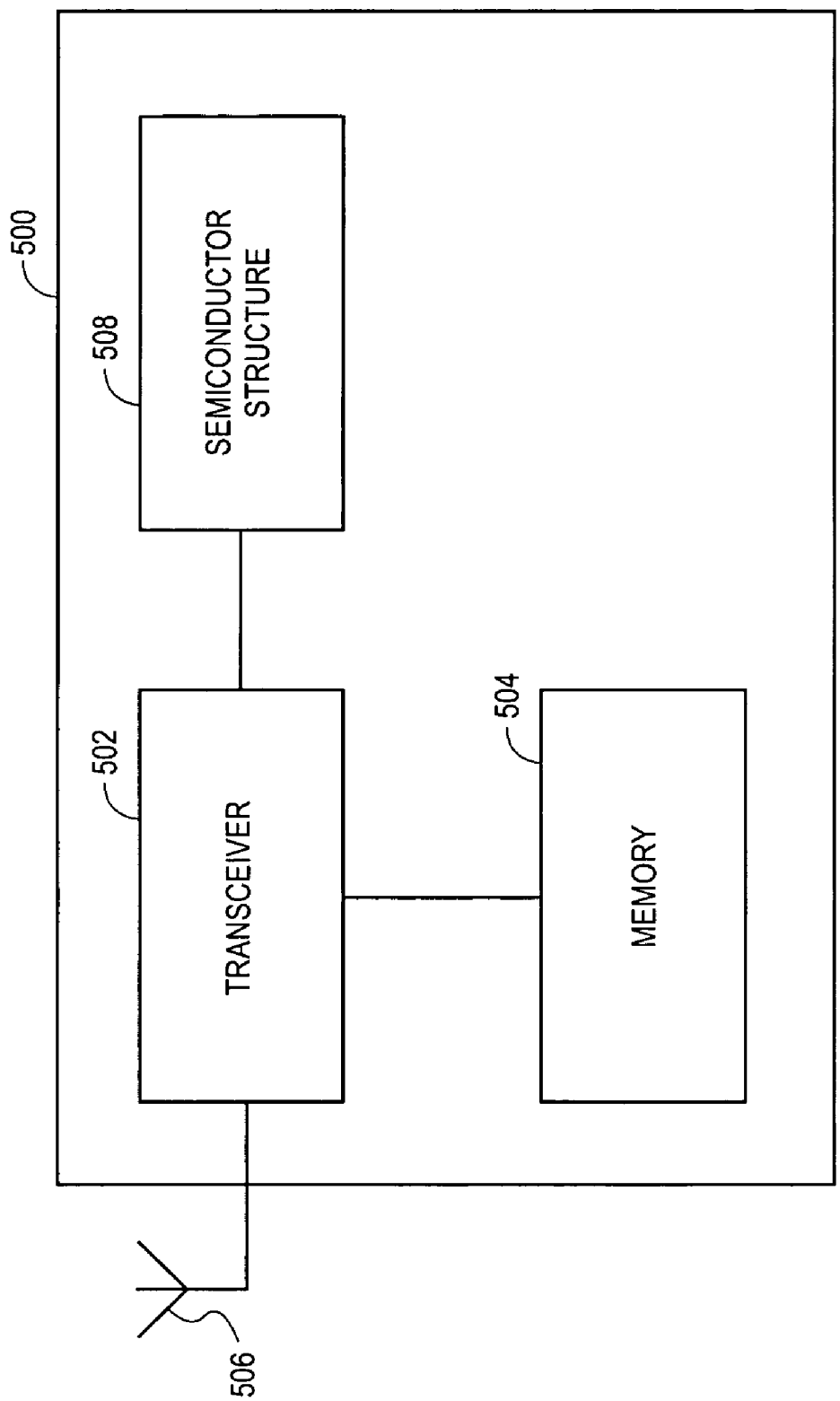
FIG. 5 is a high-level block diagram of a cellular communication system according to an embodiment of the present invention.

FIG. 5 is a high-level block diagram of a cellular communication system 500 according to an embodiment of the present invention. The system 500 may transmit a wireless signal (e.g., radio frequency (RF) signal) for reception by another cellular communication system (not shown).

The example system 500 includes a transceiver 502 coupled to a memory 504, an antenna 506, and a semiconductor structure 508 fabricated according to embodiments of the present invention.

In one embodiment, the transceiver 502 may be a Global System for Mobile Communications (GSM) transceiver. Circuitry for implementing GSM transceivers is well known. In an alternative embodiment, the transceiver 502 may be a Personal Communication Service (PCS) transceiver. Circuitry for implementing PCS transceivers is well known.

The memory 504 may be a flash memory. Flash memories are well known. Alternatively, the memory may be a random access memory (RAM). Suitable RAM is well known.

The antenna 506 may be a dipole antenna. Dipole antennas are well known.

In one embodiment, the example structure 508 selects the transmission frequency of the wireless signal.

Although embodiments of the present invention have been described with respect to depositing a layer of material on a wafer surface, embodiments are not so limited. For example, the layer of material described herein or the sacrificial layer of material described herein may be deposited on multiple (i.e., two or more) layer stack of films disposed on a wafer. In a typical multiple layer stack, the layers may include silicon nitride (SiN), aluminum (Al), silicate ($SiO_2$), etc.

Embodiments of the present invention may be implemented using hardware, software, or a combination thereof. In implementations using software, the software may be stored on a machine-accessible medium.

A machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), as well as electrical, optical, acoustic, or other form of propagated signals (e.g., carrier waves, infrared signals, digital signals, etc.).

The above description of illustrated embodiments of the invention is not intended to be exhaustive or to limit embodiments of the invention to the precise forms disclosed. While specific embodiments of, and examples for, the invention are described herein for illustrative purposes, various equivalent modifications are possible within the scope of embodiments of the invention, as those skilled in the relevant art will recognize. These modifications can be made to the embodiments of the invention in light of the above detailed description.

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Some parts of this description have been presented using terms such as, silicon, germanium, deposition, substrate, and so forth. These terms are commonly employed by those skilled in the art to convey the substance of their work to others skilled in the art.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment"

in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method, comprising:
    fabricating a micro-electrical-mechanical system (MEMS) frequency-selective device by:
        forming a layer of material on a silicon wafer, the silicon wafer having variations in surface topology comprising at least one thick region and at least one thin region, the layer of material having variations in surface topology caused by the variations in the surface topology of the silicon wafer, the variations in the surface topology of the layer of material comprising at least one thick region and at least one thin region corresponding to the thick regions and the thin regions of the wafer, respectively; and
        forming at least one narrow region and at least one wide region in the layer of material, proportions of the narrow regions and proportions of the wide regions corresponding to the thick regions and the thin regions of the wafer caused by the variations in the surface topology of the silicon wafer, respectively.

2. The method of claim 1, further comprising:
    exposing photoresist disposed on the layer of material to light through a mask having a pattern to which near-resolution marks have been added; and
    removing portions of the layer of material to leave the narrow regions and the wide regions.

3. The method of claim 1, further comprising:
    characterizing the thick regions of the wafer as first zones;
    characterizing the thin regions of the wafer as second zones; and
    forming the narrow regions in the first zones and the wide regions in the second zones.

4. The method of claim 3, further comprising:
    setting first imaging compensation for the first zones and second imaging compensation for the second zones; and
    removing areas of the layer of material to leave the narrow regions in the first zones and the wide regions in the second zones.

5. The method of claim 1, further comprising mapping the surface topology of the wafer to determine the thick regions and the thin regions of the wafer.

6. The method of claim 5, further comprising ellipsometric mapping, laser mapping, or capacitance mapping of the surface topology of the wafer to determine the thick regions and the thin regions of the wafer.

7. An article of manufacture, comprising:
    a machine-accessible medium including data that, when accessed by a machine, cause the machine to perform the operations comprising fabricating a micro-electrical-mechanical system (MEMS) frequency-selective device by:
        forming a layer of material on a silicon wafer, the silicon wafer having variations in surface topology caused by the variations in the surface topology of the silicon wafer, the variations in the surface topology of the layer of material comprising at least one thick region and at least one thin region, the layer of material having variations in surface topology comprising at least one thick regions and at least one thin region corresponding to the thick regions and the thin regions of the wafer, respectively; and
        forming at least one narrow region and at least one wide region in the layer of material, proportions of the narrow regions and proportions of the wide regions corresponding to the thick regions and the thin regions of the wafer caused by the variations in the surface topology of the silicon wafer, respectively.

8. The article of manufacture of claim 7, wherein the machine-accessible medium further includes data that cause the machine to perform operations comprising:
    exposing photoresist disposed on the layer of material to light through a mask having a pattern to which near-resolution marks have been added; and
    removing portions of the layer of material to leave the narrow regions and the wide regions.

9. The article of manufacture of claim 7, wherein the machine-accessible medium further includes data that cause the machine to perform operations comprising:
    characterizing the thick regions of the wafer as first zones;
    characterizing the thin regions of the wafer as second zones; and
    forming the narrow regions in the first zones and the wide regions in the second zones.

10. The article of manufacture of claim 9, wherein the machine-accessible medium further includes data that cause the machine to perform operations comprising:
    setting first imaging compensation for the first zones and second imaging compensation for the second zones; and
    removing areas of the layer of material to leave the narrow regions in the first zones and the wide regions in the second zones.

11. The article of manufacture of claim 8, wherein the machine-accessible medium further includes data that cause the machine to perform operations comprising mapping the surface topology of the wafer to determine the thick regions and the thin regions of the wafer.

12. A method, comprising:
    fabricating a micro-electrical-mechanical system (MEMS) frequency-selective device by:
        forming a first layer of material on a silicon wafer, the silicon wafer having variations in surface topology comprising thick and thin regions, the layer of material having variations in surface topology caused by the variations in the surface topology of the silicon wafer, the variations in the surface topology of the layer of material comprising thick and thin regions corresponding to the thick and thin regions of the wafer, respectively;
        forming a sacrificial layer of material on the first layer, the sacrificial layer of material having variations in surface topology comprising thick and thin regions corresponding to the thick and thin regions of the first layer, respectively; and
        forming narrow and wide regions in the sacrificial layer of material, proportions of the narrow and propor tions of the wide regions corresponding to the thick and thin regions of the wafer caused by the variations in the surface topology of the silicon wafer, respectively.

13. The method of claim 12, further comprising direct writing the near-resolution pattern using at least one of an electron beam, ultraviolet (UV) light, x-rays, or an optical beam.

14. The method of claim 12, further comprising forming the narrow and wide regions in the sacrificial layer of material using direct write of a near-resolution pattern on a photosensitive polymer disposed on the sacrificial layer.

15. The method of claim 12, further comprising forming the narrow and wide regions in the sacrificial layer of material using direct write of a near-resolution pattern on a non-polymer photoresist disposed on the sacrificial layer.

16. The method of claim 12, further comprising:
characterizing the thick regions of the wafer as first zones;
characterizing the thin regions of the wafer as second zones; and
forming the narrow regions in the first zones and the wide regions in the second zones.

17. The method of claim 16, further comprising:
setting first image compensation for the first zones and second image compensation for the second zones; and
removing areas of the layer of material to leave the narrow regions in the first zones and the wide regions in the second zones.

18. The method of claim 12, further comprising mapping the surface topology of the wafer to determine the thick regions and the thin regions of the wafer.

* * * * *

UNITED STATES PATENT AND TRADEMARK OFFICE
CERTIFICATE OF CORRECTION

PATENT NO. : 7,262,070 B2 Page 1 of 1
APPLICATION NO. : 10/675587
DATED : August 28, 2007
INVENTOR(S) : Doros et al.

It is certified that error appears in the above-identified patent and that said Letters Patent is hereby corrected as shown below:

In column 8, at line 67, delete "propor" and insert --proportions--.

In column 9, at line 1, delete "tions".

Signed and Sealed this

Twenty-ninth Day of April, 2008

JON W. DUDAS
*Director of the United States Patent and Trademark Office*